(12) United States Patent
Mercier

(10) Patent No.: US 8,280,329 B2
(45) Date of Patent: Oct. 2, 2012

(54) RECEIVER HAVING A GAIN-CONTROLLABLE INPUT AMPLIFIER

(75) Inventor: Frederic Mercier, Saint Manvieu Norrey (FR)

(73) Assignee: NXP B.V., Eindhoven (NL)

( * ) Notice: Subject to any disclaimer, the term of this patent is extended or adjusted under 35 U.S.C. 154(b) by 753 days.

(21) Appl. No.: 11/908,280

(22) PCT Filed: Mar. 3, 2006

(86) PCT No.: PCT/IB2006/050674
§ 371 (c)(1),
(2), (4) Date: Aug. 24, 2009

(87) PCT Pub. No.: WO2006/095296
PCT Pub. Date: Sep. 14, 2006

(65) Prior Publication Data
US 2009/0305655 A1    Dec. 10, 2009

(30) Foreign Application Priority Data

Mar. 10, 2005   (EP) .................................... 05300176

(51) Int. Cl.
*H04B 1/06* (2006.01)
*H04B 7/00* (2006.01)

(52) U.S. Cl. ..................... 455/234.1; 455/260; 455/334; 330/278

(58) Field of Classification Search .................. 455/230, 455/232.1, 234.1, 240.1, 255–260, 323, 333, 455/334; 330/278
See application file for complete search history.

(56) References Cited

U.S. PATENT DOCUMENTS

| | | | |
|---|---|---|---|
| 3,872,395 A | 3/1975 | Holland | |
| 4,574,249 A * | 3/1986 | Williams | ........................ 330/59 |
| 5,602,510 A * | 2/1997 | Bayruns et al. | ................ 330/282 |
| 5,757,230 A | 5/1998 | Mangelsdorf | |
| 6,008,750 A * | 12/1999 | Cottle et al. | ..................... 342/42 |
| 6,028,496 A | 2/2000 | Ko et al. | |
| 6,307,433 B1 | 10/2001 | Ikeda | |
| 6,441,686 B1 | 8/2002 | Nakamura | |
| 6,466,090 B1 | 10/2002 | Giuroiu | |
| 2002/0180520 A1 | 12/2002 | Ueno et al. | |
| 2005/0195024 A1 | 9/2005 | Cheng | |

FOREIGN PATENT DOCUMENTS

| | | |
|---|---|---|
| EP | 1538744 A1 | 6/2005 |
| JP | 2001156566 A | 6/2001 |
| WO | 96/13896 A2 | 5/1996 |
| WO | 2004013961 A1 | 2/2004 |

* cited by examiner

Primary Examiner — Nhan Le

(57) ABSTRACT

A receiver has an input amplifier (RFAMP) that comprises a signal-voltage amplifier (SVA) and a feedback path (FBP). The signal-voltage amplifier (SVA) provides a voltage gain (VG) from an input node (SESf) to an output node (SON). The voltage gain (VG) is controllable. The feedback path (FBP) provides a transadmittance (GM) from the output node (SON) to the input node (SIN). The transadmittance (GM) is controllable.

11 Claims, 4 Drawing Sheets

RECEIVER HAVING A GAIN-CONTROLLABLE INPUT AMPLIFIER

FIELD OF THE INVENTION

An aspect of the invention relates to a receiver that has a gain-controllable input amplifier. The receiver may be, for example, a television receiver that derives video, audio, and other data, from a selected channel in a radiofrequency spectrum. In such a receiver, the gain-controllable input amplifier typically brings the radiofrequency spectrum at an appropriate signal level for further processing.

Other aspects of the invention relate to a gain-controllable amplifier as such, an information-rendering system, and a computer program for a receiver.

DESCRIPTION OF PRIOR ART

U.S. Pat. No. 3,872,395 describes a signal conditioning circuit including an operational amplifier, a variable source of offset potential and four resistive impedances operatively associated in such a manner that the circuit has constant input impedance independent of gain and offset adjustments. Gain change is effected by varying one of the impedances in an amplifier feedback circuit and offset adjustment is effected through variation of the offset potential source.

SUMMARY OF THE INVENTION

According to an aspect of the invention, a receiver has an input amplifier that comprises a signal-voltage amplifier and a feedback path. The signal-voltage amplifier provides a voltage gain from an input node to an output node. The voltage gain is controllable. The feedback path provides a transadmittance from the output node to the input node. The transadmittance is controllable.

The invention takes the following aspects into consideration. In a receiver, an input amplifier provides a gain, which is generally a compromise between noise and distortion. Increasing the gain generally reduces the noise, but increases the distortion. Conversely, decreasing the gain generally reduces the distortion, but increases the noise. There is an optimum gain, which provides the best compromise. The optimum gain depends on input signal conditions. The optimum gain is relatively high when input signals are relatively weak. Conversely, the optimum gain is relatively low when input signals are relatively strong. The optimum gain can be achieved at various different input signal conditions when the gain of the input amplifier is controllable, that is, when the gain can be varied as a function of detected input signal conditions.

There is another characteristic of the input amplifier that affects quality of reception. The input amplifier has an input impedance that constitutes a load for the circuit, or any other electrical entity, that precedes the input amplifier. As a result, the input impedance of the input amplifier affects electrical characteristics of the circuit that precedes the input amplifier. In general, these electrical characteristics are appropriate only when the input impedance is within a specific range of values. That is, there should be sufficient impedance match between the input amplifier and the circuit that precedes the input amplifier. For example, a filter may precede the input amplifier. The filter characteristics will deteriorate when there is insufficient impedance match; the input impedance of the input amplifier is either too high or too low. As another example, the input amplifier may be coupled to a cable network. There will be disturbing signal reflections when there is insufficient impedance match.

There are circuit configurations that allow a controllable gain and a substantially fixed input impedance, in the sense that the input impedance remains within a desired range of values. One possible circuit configuration comprises an amplifier circuit that has a low-impedance input and a series-resistance, which is coupled between an input node of the input amplifier and the low-impedance input. The series-resistance substantially determines the input impedance. The aforementioned prior art is an example of such a circuit configuration, in which the amplifier circuit comprises an operational amplifier and a controllable resistance coupled between an output and an inverting input of the operational amplifier. The gain varies as a function of this controllable resistance, which, however, does not affect the input impedance. Another possible circuit configuration comprises an amplifier circuit that has a high-impedance input and shunt-resistance, which is coupled between the high-impedance input and signal ground. The shunt-resistance substantially determines the input impedance.

The circuit configurations described hereinbefore perform moderately in terms of noise. That is, these circuit configurations add relatively much noise to a desired signal, which means these circuit configurations have a relatively poor noise figure. This is because the resistance, which substantially determines the input impedance, produces noise and dissipates input signal power. The resistance introduces a signal loss, which affects signal-to-noise ratio.

In a receiver, the noise figure of the input amplifier determines to a relatively large extent the noise figure of the receiver. This is particularly true when gain of the input amplifier is set to a low value because, for example, there are one or more strong signals in the radiofrequency spectrum. Consequently, the receiver will have a relatively poor sensitivity if the input amplifier has a circuit configuration as described hereinbefore. Although the gain is controllable and the input impedance is substantially fixed, the quality of reception will be relatively modest in the case of a weak input signal because the noise figure is relatively poor. The receiver will have a relatively poor sensitivity.

In accordance with the aforementioned aspect of the invention, the input amplifier comprises a signal-voltage amplifier which provides a controllable voltage gain from an input node to an output node. A feedback path provides a controllable transadmittance from the output node to the input node.

The input impedance of the input amplifier is equal to a signal voltage at the input node divided by a signal current at the input node. The signal-voltage amplifier amplifies the signal voltage at the input node so that a signal voltage is present at the output node. The signal voltage at the output node is the signal voltage at the input node multiplied by the voltage gain, which the signal-voltage amplifier provides. The transadmittance converts the signal voltage that is present on the output node into a signal current that flows to the input node. Consequently, the voltage gain and the transadmittance define the input impedance of the input amplifier. Since the transadmittance is controllable, the input impedance can be kept within a desired range of values when the voltage gain varies. There is no need for an input-impedance defining resistance at the input node, which would otherwise introduces a signal loss and deteriorate noise performance. For those reasons, the invention allows better quality of reception.

These and other aspects of the invention will be described in greater detail hereinafter with reference to drawings.

DETAILED DESCRIPTION

Figure 1:
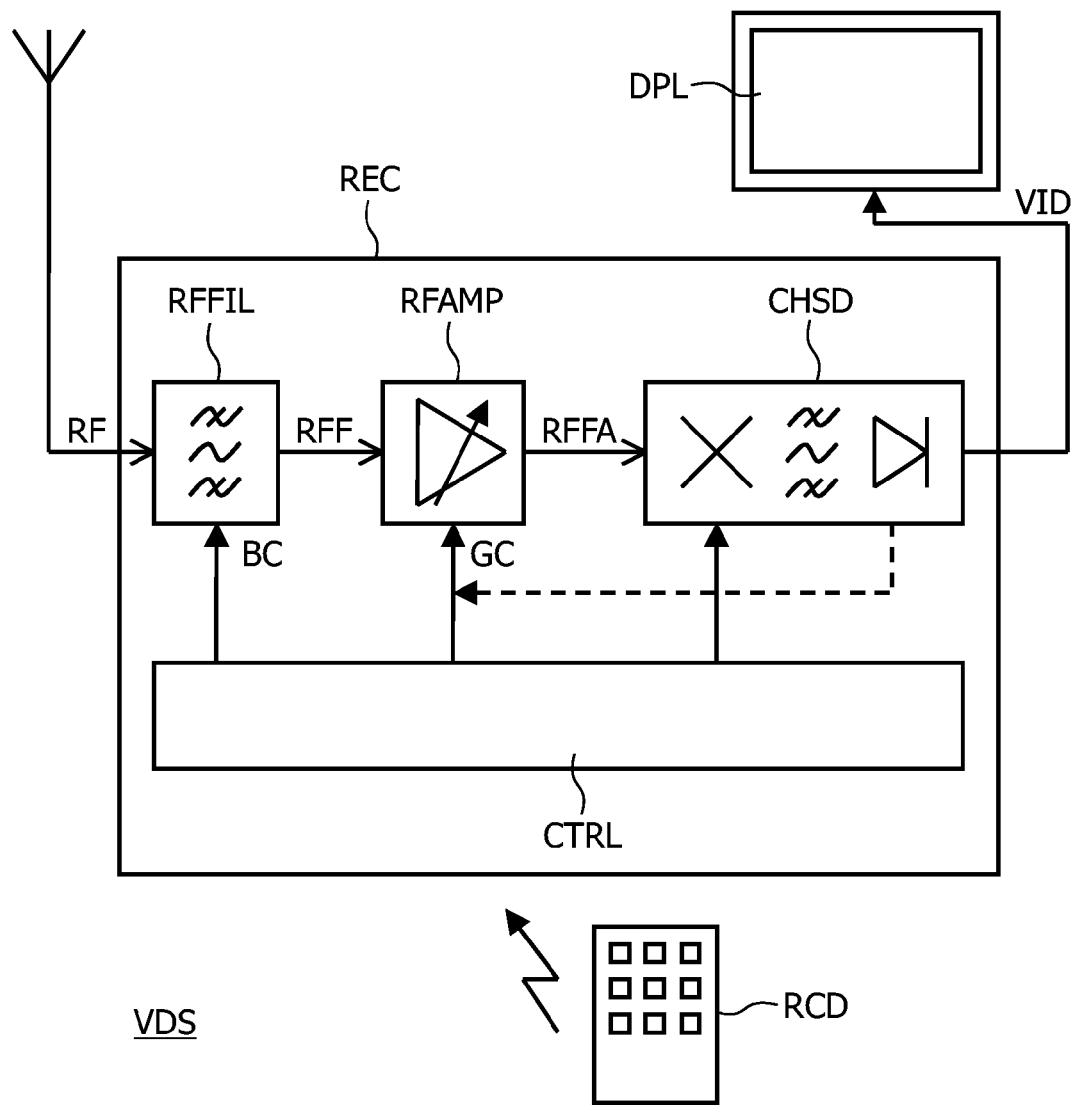
FIG. 1 is a block diagram that illustrates video-display system.

FIG. 1 illustrates a video-display system VDS. The video-display system VDS comprises a receiver REC and a display device DPL. The receiver REC derives a video signal VID from a desired channel in a radiofrequency spectrum RF, which the receiver REC receives. The display device DPL displays the video signal VID. A user can select the desired channel by means of, for example, a remote-control device RCD. The receiver REC may be in the form of, for example, a television set, a settop box, or a digital video recorder, or the like.

The receiver REC comprises a radiofrequency filter RFFIL, a radiofrequency amplifier RFAMP, a channel selection-and-detection circuit CHSD, and a controller CTRL. The radiofrequency filter RFFIL selects a desired frequency band within the radiofrequency spectrum RF, which the receiver REC receives. For example, the radiofrequency filter RFFIL may select a particular television band within which the desired channel is located. The radiofrequency filter RFFIL provides a filtered radiofrequency spectrum RFF, which comprises channels that are present in the selected television band. Channels that are outside the selected television band are suppressed. A band-control signal BC can make the radiofrequency filter RFFIL switch from one frequency band to another frequency band.

The radiofrequency amplifier RFAMP amplifies the filtered radiofrequency spectrum RFF so as to provide a filtered-and-amplified radiofrequency spectrum RFFA, which has an appropriate signal power. To that end, the radiofrequency amplifier RFAMP has a gain, which is controllable. The gain is controlled so that the filtered-and-amplified radiofrequency spectrum RFFA has the appropriate signal power, which is a compromise between noise and distortion. A gain-control signal GC determines the gain of the radiofrequency amplifier RFAMP. The channel selection-and-detection circuit CHSD may provide the gain-control signal GC. Alternatively, the controller CTRL may provide a gain-control signal GC on the basis of, for example, data received from the channel selection-and-detection circuit CHSD or any other circuit in signal path that extends between the radiofrequency spectrum RF and the video signal VID.

The channel selection-and-detection circuit CHSD suppresses any signals that are outside the desired channel. To that end, the channel selection-and-detection circuit CHSD may comprise a frequency converter followed by a channel selection filter, which has a particular pass band. The frequency converter carries out a frequency shift so that the desired channel falls within the pass band of the channel selection filter. A demodulator derives a baseband signal from a signal within the desired channel, which has been pass-band filtered. The baseband signal may undergo further processing, which may include, for example, channel decoding, error correction, and baseband decoding, such as, for example, MPEG 2 decoding. The video signal VID results from this processing.

The radiofrequency amplifier RFAMP determines to a relatively large extent quality of reception. In particular, the radiofrequency amplifier RFAMP substantially determines the sensitivity of the receiver REC. Noise figure is often used as a figure of merit for the sensitivity.

The following aspects further determine the quality of reception. The radiofrequency amplifier RFAMP has a certain input impedance. This input impedance constitutes a load impedance for the radiofrequency filter RFFIL. The radiofrequency filter RFFIL provides a desired filter characteristic when the load impedance has a particular value for which the radiofrequency filter RFFIL has been designed. This desired load impedance may be, for example, 50 or 75 ohms. Conversely, the radiofrequency filter RFFIL may provide a deteriorated filter characteristic when the load impedance has a value that substantially differs from the desired value for which the radiofrequency filter RFFIL has been designed. In that case, there is an impedance mismatch between the radiofrequency filter RFFIL and the radiofrequency amplifier RFAMP. This impedance mismatch may adversely affect suppression of signals that are outside the desired frequency band. The impedance mismatch may also cause signal losses in the desired frequency band, which adversely affects the noise figure.

What is more, the aforementioned impedance mismatch may cause the receiver REC to have an input impedance that substantially differs from a desired value, for example, 50 or 75 ohms. That is, the impedance mismatch between the radiofrequency filter RFFIL and the radiofrequency amplifier RFAMP may cause a receiver input-impedance mismatch. The receiver input-impedance mismatch may cause, for example, reflections in a cable network which conveys the radiofrequency spectrum RF. For those reasons, it is desirable that the radiofrequency amplifier RFAMP has a substantially fixed input impedance, which corresponds with the load impedance for which the radiofrequency filter RFFIL has been designed.

Figure 2:
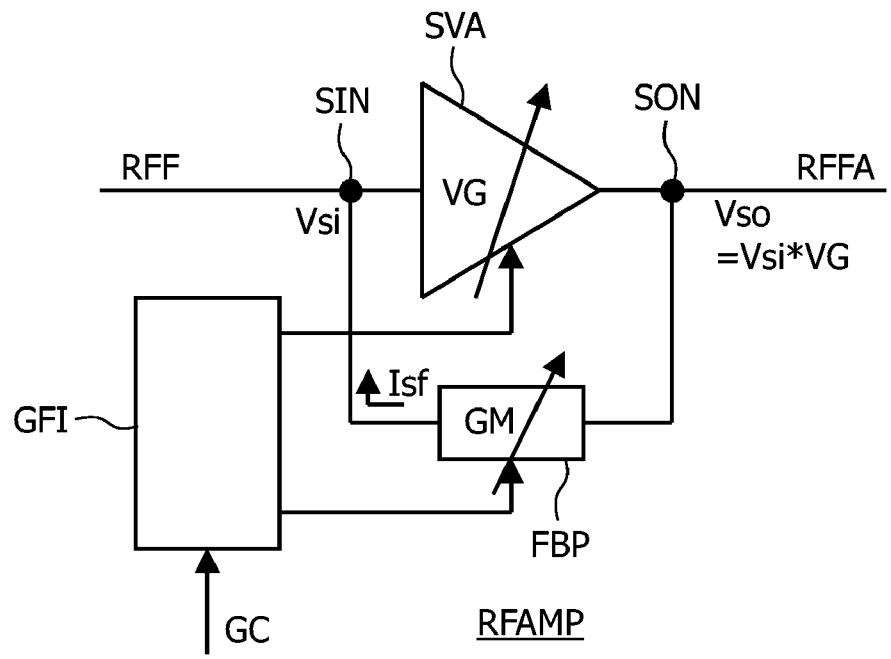
FIG. 2 is a conceptual diagram that illustrates a radiofrequency amplifier of the video-display system.

FIG. 2 illustrates the radiofrequency amplifier RFAMP. The radiofrequency amplifier RFAMP has an input-signal node SIN, which receives the filtered radiofrequency spectrum RFF, and an output-signal node SON, which provides the filtered-and-amplified radiofrequency spectrum RFFA. A signal-voltage amplifier SVA and a feedback path FBP are coupled between the input-signal node SIN and the output-signal node SON. The signal-voltage amplifier SVA provides a voltage gain VG, which is controllable. The feedback path FBP provides a transadmittance GM, which is controllable. The transadmittance GM is a voltage-to-current conversion factor.

A gain-and-feedback control interface GFI controls the voltage gain VG and the transadmittance GM on the basis of the gain-control signal GC, which the radiofrequency amplifier RFAMP receives. The signal-voltage amplifier SVA and the gain-and-feedback control interface GFI may share one or more components. That is, the aforementioned entities need not necessarily be separate circuits. In that respect, FIG. 2 should be regarded as a conceptual diagram. The same remarks apply to the feedback path FBP, which may also share one or more components with the gain-and-feedback control interface GFI.

The feedback path FBP provides a feedback signal-current Isf. The feedback signal-current Isf varies as a function of an output signal-voltage Vso, which is present on the output-signal node SON. The feedback path FBP determines this function. Preferably, the feedback signal-current Isf is a linear function of the output signal-voltage Vso. In a mathematical expression:

$$Isf = GM \cdot Vso + \partial$$

wherein ∂ denotes any other components that may form part of the feedback signal-current Isf.

The output signal-voltage Vso is equal to an input signal-voltage Vsi, which is present on the input-signal node SIN, multiplied by the voltage gain VG. Consequently, the feedback signal-current Isf varies as a function of the input signal-voltage Vsi. The voltage gain VG and the feedback path FBP determines this function.

The input impedance of the radiofrequency amplifier RFAMP is substantially equal to a variation of the input signal-voltage Vsi divided by a variation of the feedback signal-current Isf, which the variation of the input signal-voltage Vsi has caused. The voltage gain VG and the feedback path FBP determine the variation of the feedback signal-current Isf. Consequently, the voltage gain VG and the feedback path FBP determine the input impedance of the radiofrequency amplifier RFAMP. The voltage gain VG, which is controllable, preferably varies in dependence on signal conditions within the radiofrequency spectrum RF. The voltage gain VG is a relatively high when input signals a relatively weak. Conversely the voltage gain VG is relatively low when input signals a relatively strong. The gain-and-feedback control interface GFI controls the feedback path FBP so that the input impedance of the radiofrequency amplifier RFAMP remains substantially equal to the desired value, despite voltage-gain variations.

For example, let it be assumed that the feedback path FBP is a feedback resistance whose value is controllable. In that case, the feedback signal-current Isf is equal to the difference between the output signal-voltage Vso and input signal-voltage Vsi divided by the value of the feedback resistance. In a mathematical expression:

$$Isf = (Vso - Vsi)/Rf$$

wherein Rf denotes the feedback resistance. In this example, the transadmittance GM is the inverse of the feedback resistance Rf: GM=1/Rf The term ∂ comprises −Vsi/Rf in this example.

The input impedance of the radiofrequency amplifier RFAMP is equal to the input signal-voltage Vsi divided by the feedback signal-current Isf. Consequently, the input impedance of the radiofrequency amplifier RFAMP is equal to the feedback resistance Rf divided by the voltage gain VG plus one. In a mathematical expression:

$$Zin = Rf/(VG+1)$$

In this example, the gain-and-feedback control interface GFI may control the feedback resistance Rf so that the value thereof varies substantially proportionately with the voltage gain VG. In that case, the input impedance of the radiofrequency amplifier RFAMP will vary to a relatively small extent only when the voltage gain VG varies. In other words, the input impedance is substantially fixed. This is particularly true if the voltage gain VG is relatively high.

It should be noted that FIG. 2 is a conceptual diagram, in particular with regard to the gain-and-feedback control interface GFI. For example, the gain-and-feedback control interface GFI may be comprised in the controller CTRL of the receiver REC illustrated in FIG. 1. In such an embodiment, the gain-and-feedback control interface GFI may be in the form of software, which has been loaded into a microprocessor that forms part of the controller CTRL. The software may calculate an appropriate value for the voltage gain VG and an appropriate value for the transadmittance GM on the basis of, for example, the radiofrequency spectrum RF received. The software may further cause a digital-to-analog converter to provide corresponding control signals, which are applied to the signal-voltage amplifier SVA and the feedback path FBP.

Figure 3:
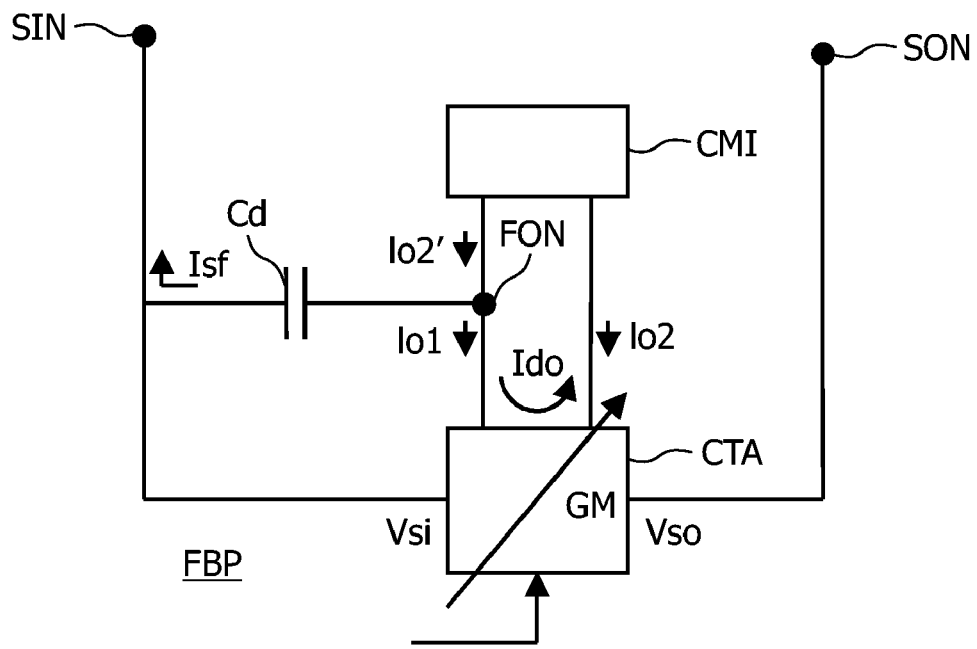
FIG. 3 is a block diagram that illustrates a controllable current-feedback circuit, which forms part of the radiofrequency amplifier.

FIG. 3 illustrates an implementation principle of the feedback path FBP, which comprises active components. The feedback path FBP comprises a controllable-transadmittance stage CTA, a current mirror CMI, and a decoupling capacitor Cd. The controllable-transadmittance stage CTA substantially defines the transadmittance GM mentioned hereinbefore in connection with FIG. 2.

More specifically, the controllable-transadmittance stage CTA provides a differential output current Ido in response to the output signal-voltage Vso and, in addition, the input signal-voltage Vsi. The differential output current Ido is equal to the difference between the output signal-voltage Vso and the input signal-voltage Vsi multiplied by the transadmittance GM of the controllable-transadmittance stage CTA. The controllable-transadmittance stage CTA provides the differential output current Ido in the form of two output current components Io1, Io2. The current mirror CMI provides a copy Io2' of output current component Io2. The copy Io2' of output current component Io2 is subtracted from the other output current component Io1 at a feedback output node FON. The feedback signal-current Isf results from this subtraction. The feedback signal-current Isf flows from the feedback output node FON to the signal input node via the decoupling capacitor Cd.

The implementation principle, which FIG. 3 illustrates, simulates, as it were, the feedback resistance, whose value is controllable, mentioned hereinbefore. This is because an identical function determines the relation between the feedback signal-current Isf, on the one hand, and the output signal-voltage Vso and the input signal-voltage Vsi, on the other hand:

$$Isf = (Vso - Vsi)*GM$$

The transadmittance GM of the controllable-transadmittance stage CTA is the inverse of the feedback resistance. The term ∂ mentioned hereinbefore is equal to −Vsi GM. The transadmittance GM of the controllable-transadmittance stage CTA will be referred to as feedback transadmittance GM hereinafter.

Figure 4A:
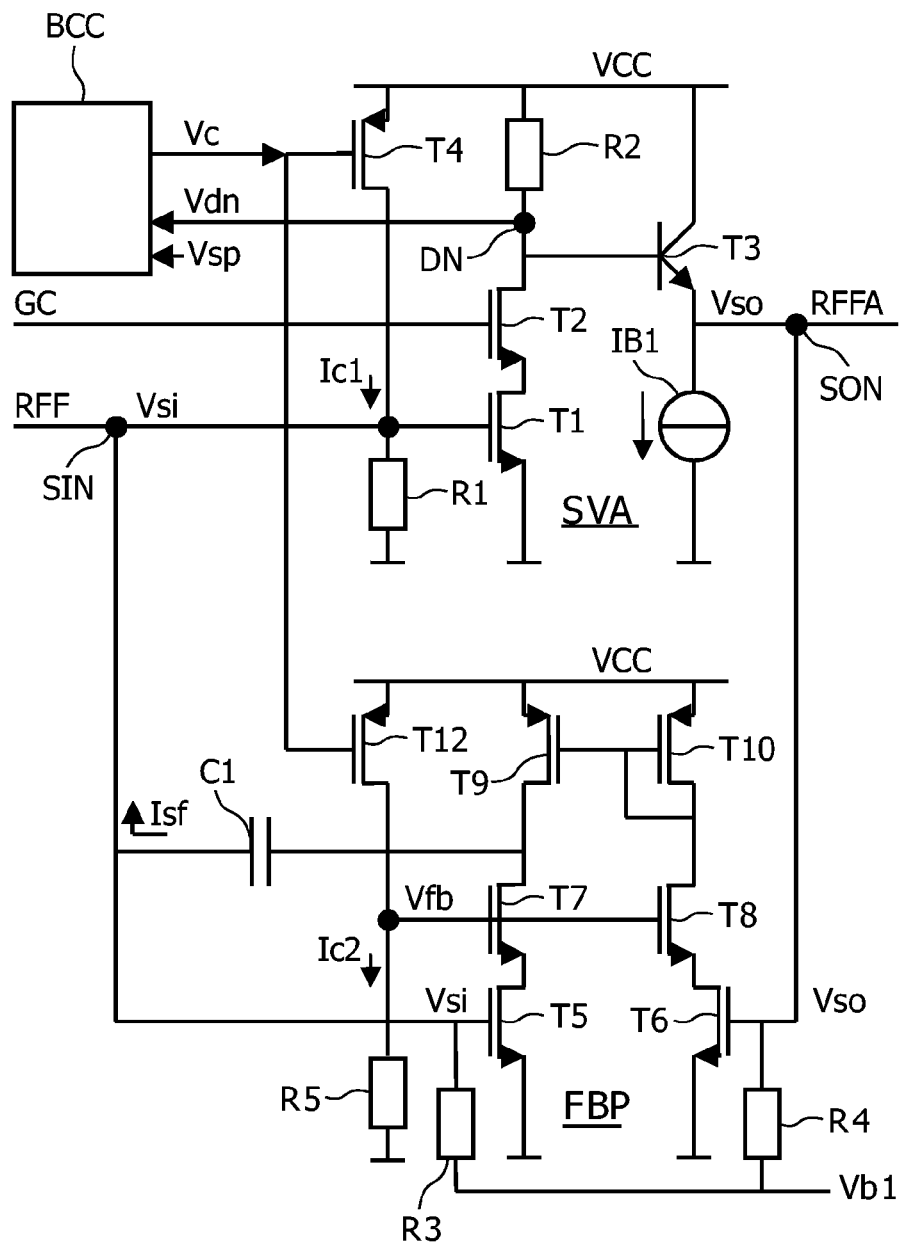
FIG. 4A is a circuit diagram that illustrates a low-noise implementation of the radiofrequency amplifier.

FIG. 4A illustrates a low-noise implementation of the radiofrequency amplifier RFAMP. FIG. 4A has an upper part, which illustrates the signal-voltage amplifier SVA, and lower part, which illustrates the feedback path FBP. The low-noise implementation further comprises a biasing-control circuit BCC, which can be regarded as forming part of the gain-and-feedback control interface GFI that FIG. 2 illustrates.

The signal-voltage amplifier SVA comprises four transistors T1-T4, two resistors R1, R2, and a biasing current source IB31. Transistors T1, T2 are of the field effect type. In combination, these transistors T1, T2 are equivalent to a single dual-gate field effect transistor. Transistor T2 has a gate that receives the gain-control signal GC, which is applied to the radiofrequency amplifier RFAMP. The signal-voltage amplifier SVA comprises a drain node DN. Transistors T1, T2 are coupled between the drain node DN and signal ground. Resistor R2 is coupled between the drain node DN and a supply-voltage path. Transistor T3 is in an emitter-follower configuration.

The feedback path FBP comprises seven transistors T5-T12 of the field effect type, three resistances R3, R4, R5, and a capacitor C1. Transistors T5, T7 form a combination that is equivalent to a single dual-gate field effect transistor. The same applies to transistors T6, T8. Transistors T5, T6 receive a biasing voltage Vb1 at their respective gates via resistors R3, R4, respectively.

The low-noise implementation, which FIG. 4A illustrates, operates as follows. The combination of transistors T1, T2 constitutes a transadmittance amplifier that converts the input signal-voltage Vsi into a drain signal-current. The drain signal-current has an amplitude that depends on the gain-control signal GC, which the gate of transistor T2 receives. Resistor R2 converts the drain signal-current into an amplified input signal-voltage, which is present at the drain node DN. Transistor T3 forms a buffer amplifier, which provides unity voltage gain. As a result, the output signal-voltage Vso is substantially equal to the amplified input signal-voltage. The drain node DN has a direct-current (DC) biasing voltage Vdn that depends on a DC biasing current, which flows through transistors T1, T2 and resistor R2.

A biasing-control loop causes the DC biasing voltage Vdn, which is present at the drain node DN, to be substantially equal to a set-point voltage Vsp. The biasing-control loop comprises the biasing-control circuit BCC, transistor T4, resistor R1, transistors T1, T2, and resistor R2. The biasing-control circuit BCC provides a biasing control-voltage Vc, which varies as a function of the difference between the DC biasing voltage Vdn at the drain node DN and the set-point voltage Vsp. The biasing control-voltage Vc, which is applied to a gate of transistor T4, determines a biasing control-current Ic1 that flows through resistor R1, which is coupled to a gate of transistor T1. Accordingly, the biasing control-current Ic1 determines a gate biasing-voltage, which is present at a gate of transistor T1. The gate-biasing voltage determines the DC biasing current that flows through transistors T1, T2, and resistor R2.

Let it be assumed that the DC biasing voltage at the drain node DN increases somewhat with respect to the set-point voltage Vsp. In response, the biasing-control circuit BCC will adjust the biasing control-voltage Vc so that the biasing control-current Ic1, which transistor T4 provides, increases. As a result, the gate biasing-voltage will increase and the DC biasing current, which flows through transistors T1, T2 and resistor R2, will increase too. This counteracts the increase of the DC biasing voltage Vdn present at the drain node DN. In a steady-state condition, the DC biasing voltage Vdn at the drain node DN is substantially equal to the set-point voltage Vsp.

Figure 4B:
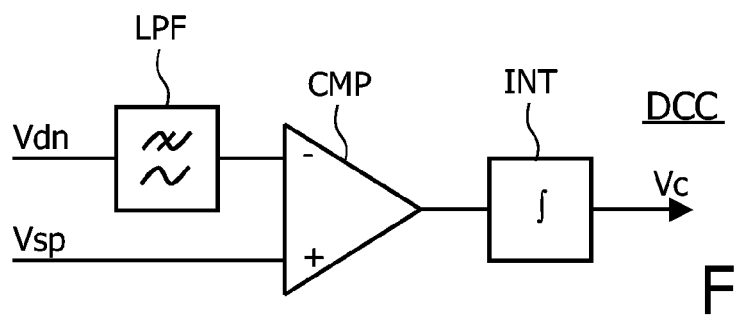
FIG. 4B is a block diagram that illustrates a biasing-control circuit that forms part of the low-noise implementation of the radiofrequency amplifier.

FIG. 4B illustrates the biasing-control circuit BCC. The biasing-control circuit BCC comprises a low-pass filter LPF, a comparator CMP, and an integrator INT. The low-pass filter LPF suppresses high frequency components, which are present at the drain node DN so as to prevent these components from reaching the comparator CMP. The comparator CMP provides a comparison result, which reflects the difference between the DC biasing voltage Vdn at the drain node DN and the set-point voltage Vsp. The integrator INT integrates the comparison result in accordance with an integration time-constant. The DC control loop has a dynamic behavior, which depends on this integration time-constant. The comparison result may be in form of current, in which case a capacitor may constitute the integrator INT.

The feedback path FBP is implemented in accordance with the principle that FIG. 3 illustrates. Transistors T5, T6, T7, and T8 form a controllable-transadmittance stage, which corresponds with the controllable-transadmittance stage CTA in FIG. 3. Transistors T9 and T10 form a current mirror, which corresponds with the current mirror CMI in FIG. 3. The capacitor C1 corresponds with the decoupling capacitor Cd in FIG. 3.

Transistors T7 and T8 each have a gate, which receives a feedback control-voltage Vfb. The transadmittance of the controllable-transadmittance stage, which corresponds with the feedback transadmittance GM in FIG. 3, varies as a function of this feedback control-voltage Vfb. The feedback control-voltage Vfb varies as a function of a copied biasing control-current Ic2, which flows through resistor R5. The copied biasing control-current Ic2, which transistor T12 provides, is a copy of the biasing control-current Ic1, which transistor T4 provides and which flows through resistor R1.

The feedback transadmittance GM varies as function of the gain-control signal GC. The following mechanism accounts for this. A variation in the gain-control signal GC causes a variation in the DC biasing current Ic1, which flows through transistors T1, T2 and resistor R2, and thus causes a variation in the DC biasing voltage Vdn at the drain node DN. The DC control loop, which has been described hereinbefore, will counteract this variation so that the DC biasing voltage Vdn remains constant. To that end, the DC control loop will adapt the gate biasing-voltage, which is applied to the gate of transistor T1, by adjusting the DC control-current Ic1, which flows through resistor R1. Transistor T12 will copy this adaptation. As a result, the variation in the gain-control signal GC causes a variation in the copied biasing control-current Ic2, which causes the feedback control-voltage Vfb to vary. Since the feedback transadmittance GM varies as a function of the feedback control-voltage Vfb, the feedback transadmittance GM varies as a function of the gain-control signal GC. The latter function has characteristics that depend on various component values such as, for example, the respective value of resistors R1 and R5.

Figure 5:
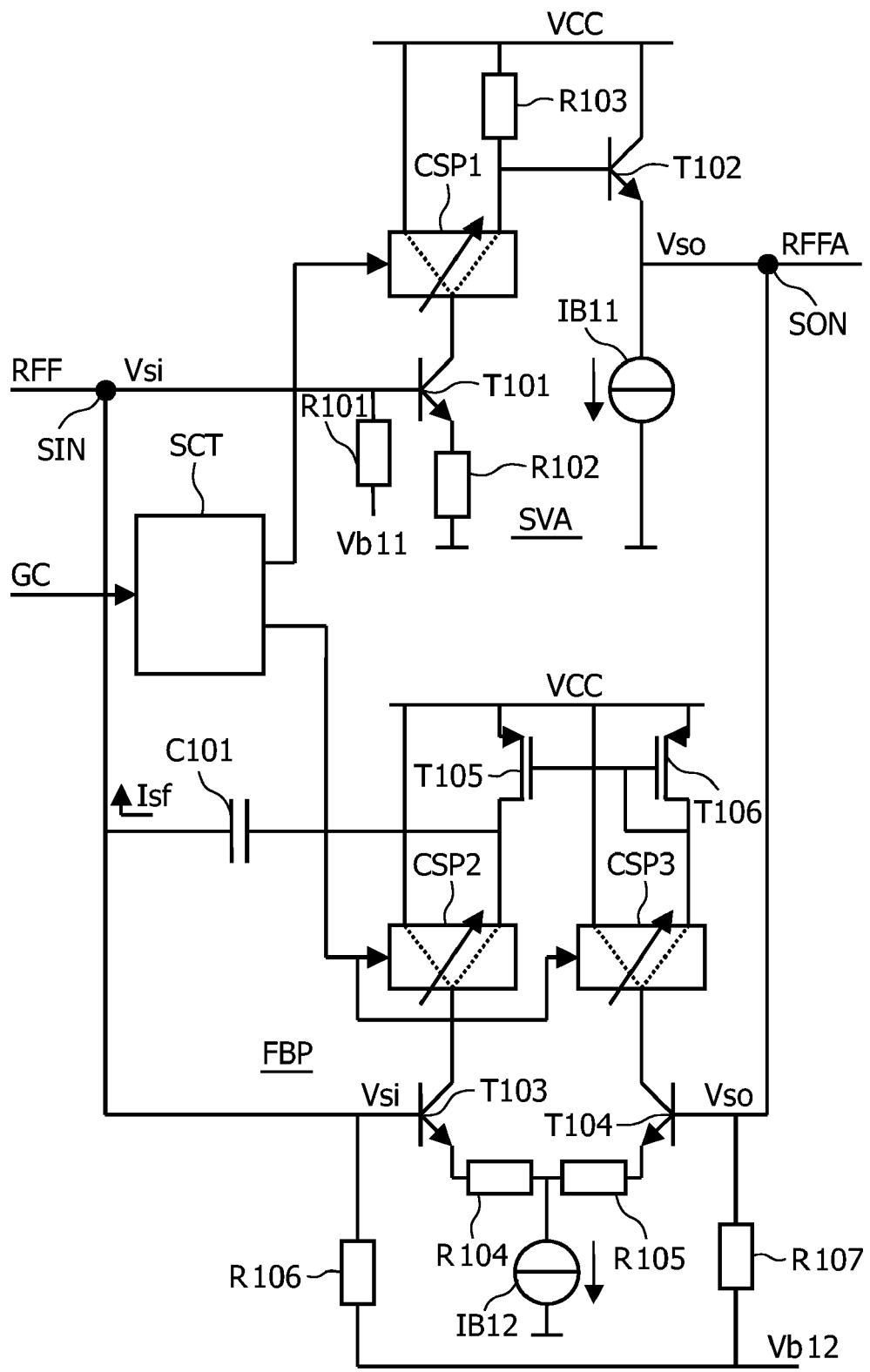
FIG. 5 is a circuit diagram that illustrates a low-distortion implementation of the radiofrequency amplifier.

FIG. 5 illustrates a low-distortion implementation of the radiofrequency amplifier RFAMP. FIG. 5 has an upper part, which illustrates the signal-voltage amplifier SVA, and lower part, which illustrates the feedback path FBP. The low-noise implementation further comprises a current-splitter control circuit SCT, which can be regarded as forming part of the gain-and-feedback control interface GFI that FIG. 2 illustrates.

The signal-voltage amplifier SVA comprises two transistors T101, T102 of the bipolar type, three resistors R101, R102, R103, a current splitter CSP1, and a biasing current source IB11. A base of transistor T100 receives a biasing voltage via resistor R100. The feedback path FBP comprises four transistors T103, T104, T105, T106, four resistors R104, R105, R106, R107, a biasing current source IB12, two current splitters CSP2, CSP3, and a capacitor C101. Respective bases of transistors T103, T104 receive a biasing voltage Vb12 via resistors R106, R107, respectively.

The low-distortion implementation, which FIG. 5 illustrates, operates as follows. Transistor T10 and resistor R102 form a transadmittance amplifier, which converts the input signal-voltage Vsi into a collector signal current. Current splitter CSP1 splits the collector signal current into two portions in accordance with a current-split factor. The current-split factor determines the respective magnitudes of these two portions. One portion of the collector signal current flows to a supply-voltage path VCC via a short circuit. This portion is lost, as it were, in the sense that it does not contribute to the voltage gain VG. The other portion of the collector signal current flows through resistor R103. Resistor R103 converts this portion, which contributes to the voltage gain VG, into an amplified signal voltage. Transistor T102 forms a buffer amplifier, which provides unity voltage gain. As a result, the output signal-voltage Vso is substantially equal to the amplified input signal-voltage.

The current splitter CSP1 constitutes a signal-current attenuator, which determines the voltage gain VG. The current-split factor mentioned hereinbefore is an attenuation factor. The current-splitter control circuit SCT controls the attenuation factor on the basis of the gain-control signal GC. The portion of the collector signal current that flows through resistor R103 is relatively large when the attenuation factor is relatively small. In that case, the voltage gain VG is relatively high. Conversely, the portion of the collector signal current that flows through transistor R103 is relatively small when the attenuation factor is relatively large. In that case, the voltage gain VG is relatively low. Accordingly, the voltage gain VG varies as a function of the gain-control signal GC. The current-splitter control circuit SCT determines, amongst other things, this function.

The feedback path FBP is implemented in accordance with the principle that FIG. 3 illustrates. Transistors T103, 104, resistors R104, R105, and the two current splitters CSP2, CSP3, form a controllable-transadmittance stage, which corresponds with the controllable-transadmittance stage CTA in FIG. 3. Transistors T105 and T106 form a current mirror, which is corresponds with the current mirror CMI in FIG. 3. The capacitor C100 is the equivalent of decoupling capacitor Cd in FIG. 3.

In more detail, transistors T103, T104 and resistors R104, R105 constitute a fixed transadmittance stage. This fixed transadmittance stage converts the difference between the output signal-voltage Vso and the input signal-voltage Vsi into a differential fixed transadmittance output current. Current splitters CSP2 and CSP3 attenuate this differential current in a fashion that is similar to fashion in which current splitter CSP1 attenuates the collector signal current, which transistor T10 provides. Accordingly, current splitters CSP2 and CSP3 provide an attenuated fixed transadmittance differential output current, which corresponds with the differential output current Ido that FIG. 3 illustrates.

Current splitters CSP2, CSP3 have an attenuation factor, which the current-splitter-control circuit SCT controls in dependence on the gain-control signal GC. Respective attenuation factors of current splitters CSP2, CSP3 vary substantially inversely proportionately with the attenuation factor of current splitter CSP1. The respective attenuation factors of current splitters CSP2, CSP3 are relatively low when the attenuation factor of current splitter CSP1 is relatively high. In that case, the voltage gain VG is relatively low and the feedback transadmittance GM is relatively high. Conversely, the respective attenuation factors of current splitters CSP2, CSP3 are relatively high when the attenuation factor of current splitter CSP1 is relatively low. In that case, the voltage gain VG is relatively high and the feedback transadmittance GM is relatively low. Accordingly, is possible to achieve a substantially fixed input impedance at the signal input node of the radiofrequency amplifier RFAMP.

The detailed description hereinbefore with reference to the drawings illustrates the following characteristics, which are cited in claim 1. A receiver has an input amplifier (RFAMP) that comprises a signal-voltage amplifier (SVA) and a feedback path (FBP). The signal-voltage amplifier (SVA) provides a voltage gain (VG) from an input node (SIN) to an output node (SON). The voltage gain (VG) is controllable. The feedback path (FBP) provides a transadmittance (GM) from the output node (SON) to the input node (SIN). The transadmittance (GM) is controllable.

The detailed description hereinbefore further illustrates the following optional characteristics, which are cited in claim 2. The receiver (REC) comprises a gain-and-feedback control interface (GFI) that controls the voltage gain (VG) and the transadmittance (GM) of the feedback path (FBP) so that the voltage gain (VG) and the transadmittance (GM) are substantially inversely proportional. This allows the input amplifier to have a substantially fixed input impedance in a relatively simple manner.

The detailed description hereinbefore further illustrates the following optional characteristics, which are cited in claim 3. The feedback path (FBP) comprises a feedback transistor-stage (T5, T6, T7, T8; T103, T104, CSP2, CSP3) that converts a signal voltage (Vso) at the output node (SON) into a feedback current (Isf) that flows to the input node (SIN). These characteristics allow cost-efficient implementations.

The detailed description hereinbefore further illustrates the following optional characteristics, which are cited in claim 4. The feedback transistor-stage (T5, T6, T7, T8; T103, T104, CSP2, CSP3) comprises a differential transistor pair (T5, T6, T7, T8; T103, T104) having an input for receiving the signal voltage (Vso) at the output node (SON) and an opposite input for receiving a signal voltage (Vsi) at the input node (SIN). These characteristics allow a behavior as if a feedback resistor were coupled between the output node and the input node.

The detailed description hereinbefore further illustrates the following optional characteristics, which are cited in claim 5. The signal-voltage amplifier (SVA) comprises an input transistor-stage (T1, T2; T101, R102) that provides a signal current in response to a signal voltage (Vsi) that is present on the input node (SIN). An impedance (R2; R103) provides an amplified signal voltage in response to the signal current, which the input transistor-stage (T1, T2; T101, R102) provides. These characteristics allow low-noise implementations.

The detailed description hereinbefore further illustrates the following optional characteristics, which are cited in claim 6. The input transistor-stage comprises a dual-gate field-effect transistor arrangement (T1, T2) having a gate coupled to receive the signal voltage (Vsi) that is present on the input node (SIN), and a further gate coupled to receive a gain control voltage (GC). FIG. 4A illustrates the aforementioned characteristics, which allow implementations that have a yet lower noise.

The detailed description hereinbefore further illustrates the following optional characteristics, which are cited in claim 7. The input transistor-stage comprises a fixed-admittance stage (T101, R102) followed by a controllable signal-current attenuator (CSP1). FIG. 5 illustrates the aforementioned characteristics, which allow low-distortion implementations.

The aforementioned characteristics can be implemented in numerous different manners. In order to illustrate this, some alternatives are briefly indicated.

A controllable impedance may form the feedback path. For example, a field-effect transistor having a drain coupled to the output node and a source coupled to the input node, or vice versa, may constitute the controllable impedance. In such a variant, a control voltage that is applied to a gate will generally define the value of the feedback impedance. The feedback path may comprise a single-ended transistor stage, although a differential transistor pair is preferable. Referring to FIG. 4A, the feedback path FPB may be modified so that the gate of transistor T5 does not receive the input signal-voltage Vsi but is coupled to signal ground. Referring to FIG. 5, the feedback path FBP may be modified in a like manner:

the base of transistor T103 does not receive the input signal-voltage Vsi but is coupled to signal ground. There are numerous other possible variants.

The signal-voltage amplifier may comprise one or more differential pairs. The signal-voltage amplifier may comprise several buffer amplifiers or other additional stages. The implementations that FIGS. 4A and 5 illustrate are merely examples. The signal-voltage amplifier may comprise a controllable impedance, which allows voltage-gain control. For example, referring to FIG. 4A, the signal-voltage amplifier SVA may be modified as follows. Transistor T2 is replaced by a short circuit. Resistor R2 is replaced by a controllable resistance, in the form of, for example, a field-effect transistor whose gate voltage determines a channel resistance between a source and a drain of the field-effect transistor. Referring to FIG. 5, the signal-voltage amplifier SVA may be modified in a like manner. Current splitter CSP1 and resistor R103 may be replaced by a controllable resistance. There are numerous other possible variants.

The feedback path may receive a control signal, which defines the transadmittance between the output node and the input node, from a digital-to-analog converter that receives a digital control word. Similarly, the signal-voltage amplifier may receive a control signal, which defines the voltage gain, from a digital-to-analog converter that receives a digital control word. A suitably programmed microprocessor may calculate the aforementioned respective control words so as to achieve an appropriate relation between the voltage gain, on the one hand, and the transadmittance between the output node and the input node, on the other hand. Alternatively, a suitably designed circuit may define an appropriate relationship between the voltage gain and the transadmittance. Such a circuit may be analog, digital, or hybrid, which is a mix of analog and digital. The appropriate relationship need not necessarily result in a substantially fixed input impedance. In certain applications, it may be desired that the input impedance varies as a function of voltage gain in accordance with a predetermined function. A suitably designed control circuit or control interface can provide that function.

There are numerous ways of implementing functions by means of items of hardware or software, or both. In this respect, the drawings are very diagrammatic, each representing only one possible embodiment of the invention. Thus, although a drawing shows different functions as different blocks, this by no means excludes that a single item of hardware or software carries out several functions. Nor does it exclude that an assembly of items of hardware or software or both carry out a function.

The remarks made herein before demonstrate that the detailed description with reference to the drawings, illustrate rather than limit the invention. There are numerous alternatives, which fall within the scope of the appended claims. Any reference sign in a claim should not be construed as limiting the claim. The word "comprising" does not exclude the presence of other elements or steps than those listed in a claim. The word "a" or "an" preceding an element or step does not exclude the presence of a plurality of such elements or steps.

The invention claimed is:

1. A receiver having an input amplifier that comprises:
a signal-voltage amplifier arranged to provide a voltage gain from an input node to an output node, the voltage gain being controllable; and
a feedback path arranged to provide a transadmittance from the output node to the input node, the transadmittance being controllable;
the signal-voltage amplifier comprising:
an input transistor-stage arranged to provide a signal current in response to a signal voltage that is present on the input node;
an impedance arranged to provide an amplified signal voltage in response to the signal current, which the input transistor-stage provides.

2. A receiver as claimed in claim 1, the receiver comprising a gain-and-feedback control interface arranged to control the voltage gain and the transadmittance of the feedback path so that the voltage gain and the transadmittance are substantially inversely proportional.

3. A receiver as claimed in claim 2, the gain-and-feedback control interface comprising a biasing control loop arranged to apply a biasing control current to the signal-voltage amplifier, the biasing control current depending on the voltage gain, and arranged to apply a copy of the biasing control current to the feedback path, the transadmittance of the feedback path depending on the copy of the biasing control current.

4. A receiver as claimed in claim 1, the feedback path comprising a feedback transistor-stage arranged to convert a signal voltage at the output node into a feedback current that flows to the input node.

5. A receiver as claimed in claim 4, the feedback transistor-stage comprising a differential transistor pair having an input for receiving the signal voltage at the output node and an opposite input for receiving a signal voltage at the input node.

6. A receiver as claimed in claim 1, the input transistor-stage comprising a dual-gate field-effect transistor arrangement having a gate coupled to receive the signal voltage that is present on the input node, and a further gate coupled to receive a gain control voltage.

7. A receiver as claimed in claim 1, the input transistor-stage comprising a fixed-admittance stage followed by a controllable signal-current attenuator.

8. An information-rendering system comprising a receiver as claimed in claim 1 arranged to retrieve an information from a received signal, and a rendering device arranged to render the information, which the receiver has retrieved.

9. A computer program for the receiver as recited in claim 8 comprising a set of instructions that, when loaded into the receiver, causes the receiver to control the voltage gain and the transadmittance of the feedback path so that the voltage gain and the transadmittance are substantially inversely proportional.

10. A receiver having an input amplifier that comprises:
a signal-voltage amplifier arranged to provide a voltage gain from an input node to an output node, the voltage gain being controllable; and
a feedback path arranged to provide a transadmittance from the output node to the input node, the transadmittance being controllable;
the receiver comprising a gain-and-feedback control interface arranged to control the voltage gain and the transadmittance of the feedback path so that the voltage gain and the transadmittance are substantially inversely proportional;
the gain-and-feedback control interface comprising a biasing control loop arranged to apply a biasing control current to the signal-voltage amplifier, the biasing control current depending on the voltage gain, and arranged to apply a copy of the biasing control current to the feedback path, the transadmittance of the feedback path depending on the copy of the biasing control current.

11. A receiver having an input amplifier that comprises:
a signal-voltage amplifier arranged to provide a voltage gain from an input node to an output node, the voltage gain being controllable; and
a feedback path arranged to provide a transadmittance from the output node to the input node, the transadmittance being controllable;

the feedback path comprising a feedback transistor-stage arranged to convert a signal voltage at the output node into a feedback current that flows to the input node;

the feedback transistor-stage comprising a differential transistor pair having an input for receiving the signal voltage at the output node and an opposite input for receiving a signal voltage at the input node.

* * * * *